(12) United States Patent
Narushima et al.

(10) Patent No.: US 10,227,710 B2
(45) Date of Patent: Mar. 12, 2019

(54) MANUFACTURING METHOD OF SILICON MONOCRYSTAL

(71) Applicant: SUMCO TECHXIV CORPORATION, Nagasaki (JP)

(72) Inventors: Yasuhito Narushima, Nagasaki (JP); Toshimichi Kubota, Nagasaki (JP); Masayuki Uto, Nagasaki (JP)

(73) Assignee: SUMCO TECHXIV CORPORATION, Nagasaki (JP)

( * ) Notice: Subject to any disclaimer, the term of this patent is extended or adjusted under 35 U.S.C. 154(b) by 9 days.

(21) Appl. No.: 15/195,181

(22) Filed: Jun. 28, 2016

(65) Prior Publication Data

US 2017/0029975 A1    Feb. 2, 2017

(30) Foreign Application Priority Data

Jul. 31, 2015   (JP) .................................. 2015-152825

(51) Int. Cl.
*C30B 15/14*    (2006.01)
*C30B 15/22*    (2006.01)
(Continued)

(52) U.S. Cl.
CPC .............. *C30B 15/22* (2013.01); *C30B 15/04* (2013.01); *C30B 15/206* (2013.01); *C30B 15/30* (2013.01); *C30B 29/06* (2013.01); *C30B 30/04* (2013.01)

(58) Field of Classification Search
CPC ........ C30B 15/14; C30B 15/20; C30B 15/203
See application file for complete search history.

(56) References Cited

U.S. PATENT DOCUMENTS 5,759,261 A * 6/1998 Dornberger ............. C30B 15/14
                                                          117/217
5,900,059 A * 5/1999 Shimanuki .............. C30B 15/14
                                                          117/217
(Continued)

FOREIGN PATENT DOCUMENTS

DE         69937579 T2      9/2008
JP        2001-240484 A     9/2001
(Continued)

OTHER PUBLICATIONS

Office Action issued in JP 2015-152825, dated Nov. 27, 2018, with English translation.
(Continued)

*Primary Examiner* — Robert M Kunemund
(74) *Attorney, Agent, or Firm* — Greenblum & Bernstein, P.L.C.

(57) ABSTRACT

A manufacturing method of a silicon monocrystal uses a monocrystal pulling-up apparatus including: a chamber; a crucible disposed in the chamber and configured to receive dopant-added melt; a pulling-up portion that pulls up a seed crystal after the seed crystal is in contact with the dopant-added melt; a cooler disposed above the crucible to cool a monocrystal that is being grown; and a magnetic field applying unit disposed outside the chamber to apply a horizontal magnetic field to the dopant-added melt. The method includes: during a formation of a shoulder of the silicon monocrystal, starting the formation while moving the cooler downward; stopping the cooler from moving downward at a stop position before a top of the shoulder reaches a level of a lower end of the cooler; and continuing the formation of the shoulder while the cooler is kept at the stop position.

2 Claims, 1 Drawing Sheet

(51) Int. Cl.
*C30B 15/04* (2006.01)
*C30B 29/06* (2006.01)
*C30B 30/04* (2006.01)
*C30B 15/20* (2006.01)
*C30B 15/30* (2006.01)

(56) References Cited

U.S. PATENT DOCUMENTS

| | | | |
|---|---|---|---|
| 6,036,776 A | 3/2000 | Kotooka et al. | |
| 6,733,585 B2* | 5/2004 | Inagaki | C30B 15/14 117/13 |
| 6,858,076 B1* | 2/2005 | Nakajima | C30B 15/14 117/13 |
| 2006/0090695 A1* | 5/2006 | Chen | C30B 15/14 117/217 |
| 2008/0184929 A1* | 8/2008 | Hisaichi | C30B 15/14 117/217 |
| 2010/0212580 A1* | 8/2010 | Kawazoe | C30B 15/04 117/19 |
| 2010/0294999 A1* | 11/2010 | Narushima | C30B 15/04 252/512 |
| 2011/0259260 A1* | 10/2011 | Takanashi | C30B 15/20 117/15 |
| 2012/0056135 A1* | 3/2012 | DeLuca | C30B 15/04 252/512 |

FOREIGN PATENT DOCUMENTS

| | | |
|---|---|---|
| JP | 2001-240492 A | 9/2001 |
| JP | 2008-019128 A | 1/2008 |
| JP | 2011-105526 | 6/2011 |
| JP | 2012-250859 | 12/2012 |
| JP | 2013-216505 A | 10/2013 |
| JP | 2014-231448 A | 12/2014 |

OTHER PUBLICATIONS

Office Action issued in DE 10 2016 214 012.4, dated Dec. 4, 2018, with English translation.

* cited by examiner

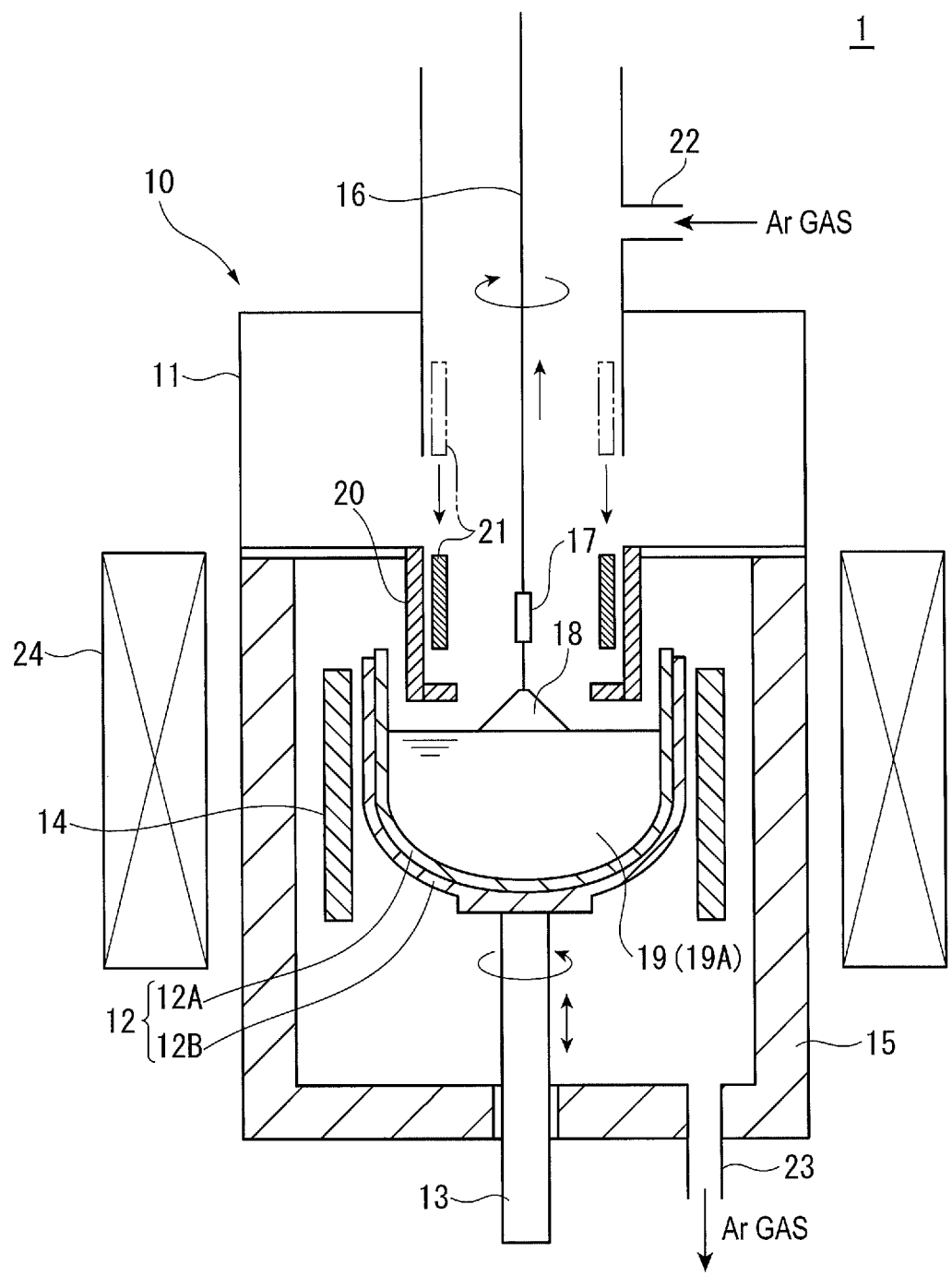

MANUFACTURING METHOD OF SILICON MONOCRYSTAL

The entire disclosure of Japanese Patent Application No. 2015-152825 filed Jul. 31, 2015 is expressly incorporated by reference herein.

TECHNICAL FIELD

The present invention relates to a manufacturing method of a silicon monocrystal.

BACKGROUND ART

In recent years, there is a growing demand for a discrete semiconductor i.e. a single-function semiconductor device with a standardized specification, unlike a complicated semiconductor device such as an IC and LSI) such as a capacitor, a transistor, a diode, a MOSFET (Metal-Oxide-Semiconductor Field-Effect Transistor) and an IGBT (Insulated Gate Bipolar Transistor). The discrete semiconductor uses a board of a low-resistivity silicon wafer. A silicon monocrystal with a resistivity as low as 20 mΩ·cm or less has come to be demanded as a material of the silicon wafer. An example of the low-resistivity silicon monocrystal is a silicon monocrystal with n-type electrical characteristics highly densely doped with a volatile dopant (e.g. arsenic, red phosphorus and antimony).

The silicon monocrystal is usually manufactured through Czochralski process (referred to as CZ process hereinafter). In order to grow a silicon monocrystal through the CZ process, it has been disclosed that a pulling-up apparatus including a cooler is used to pull up the silicon monocrystal to provide a predetermined temperature gradient (see Patent Literature 1: JP-A-2011-105526). According to Patent Literature 1, a fault-free silicon monocrystal (i.e. a monocrystal without OSF (Oxidation Induced Stacking Fault) and grown-in fault over the entire radial region) can be stably grown at a high yield rate.

However, when the above-described low-resistivity silicon monocrystal for a discrete semiconductor is manufactured using the pulling-up apparatus provided with the cooler as disclosed in Patent Literature 1, a dislocation occurs at a shoulder of the silicon monocrystal.

In order to restrain the dislocation from occurring at the shoulder of the low-resistivity silicon monocrystal, it has been disclosed to control a crystal rotation speed and crucible rotation speed when the shoulder of the monocrystal is formed by the pulling-up (see Patent Literature 2: JP-A-2012-250859). According to Patent Literature 2, since the silicon melt immediately below the crystal is efficiently stirred, the dopant in the silicon melt is diffused to improve an in-plane uniformity of the dopant in the crystal, thereby restraining the dislocation at the shoulder.

When a large-diameter (e.g. 200 mm or more) silicon monocrystal is to be pulled-up, the volume of the crucible has to be increased. In this case, a convection of the silicon melt in the crucible becomes more vigorous, so that the quality of the obtained silicon monocrystal is deteriorated. Accordingly, it is necessary to apply a magnetic field to the silicon melt to restrain the natural convection of the silicon melt in the crucible.

However, Patent Literature 2 is directed to a method in which the monocrystal is pulled up while the monocrystal and the crucible are rotated at a predetermined rotation speed. Even when the natural convection of the silicon melt is restrained by applying the magnetic field to the silicon melt, since the convection of the silicon melt inevitably occurs, the method disclosed in Patent Literature 2 is not suitable for pulling up a large-diameter low-resistivity silicon monocrystal.

SUMMARY OF THE INVENTION

An object of the invention is to provide a manufacturing method of a silicon monocrystal capable of reducing an occurrence of dislocation even when a low-resistivity large-diameter silicon monocrystal highly densely doped with a volatile dopant is pulled up.

After dedicated study, the inventors have reached the following findings.

It has been found that, in growing a low-resistivity silicon monocrystal from dopant-added melt in which silicon melt is doped with an n-type dopant, when the temperature distribution in the dopant-added melt (especially at the surface of the dopant-added melt) while the shoulder is formed becomes unstable, an abnormal growth is likely to occur at the shoulder.

It is speculated that the abnormal growth at the shoulder occurs according to the following mechanism. Specifically, a so-called necking is performed in order to remove a heat shock dislocation and the like occurred during a dipping process of a seed crystal. At this time, if a cooler is close to the dopant-added melt, the seed crystal is cooled to increase the temperature difference between the seed crystal and the dopant-added melt when the seed crystal touches the dopant-added melt, so that the dislocation becomes likely to occur.

Accordingly, the cooler is moved to an upper side (i.e. to a position at which a cooled gas does not reach the seed crystal) to keep the seed crystal from being affected by the cooled gas during the dipping and necking processes. Thus, since the temperature difference between the seed crystal and the dopant-added melt becomes small when the seed crystal touches the dopant-added melt, the occurrence of the dislocation is restrained.

When the shoulder is pulled up to be formed while the cooler is moved downward, the heat is likely to be drawn from the surface of the dopant-added melt due to the cooled gas from the cooler located close to the surface of the melt, so that the temperature distribution at the surface of the dopant-added melt becomes unstable.

Especially, since a free surface area of the dopant-added melt during the formation of the shoulder is larger than that during the subsequent formation of the straight body, the heat-dissipation amount from the dopant-added melt by the cooler increases, so that the temperature distribution on the surface of the dopant-added melt is likely to become unstable.

On the other hand, since the surface of the shoulder is slanted so that the cooler and a part of the shoulder face with each other at an angle close to a perpendicular, it is possible that the crystal growth becomes unstable because heat is likely to be drawn from the surface of the shoulder due to the cooled gas from the cooler and the heat-dissipation amount from the silicon monocrystal increases.

Further, when the speed for changing a gap between the lower end of the cooler and a liquid level of the dopant-added melt (i.e. a lowering speed of the cooler and/or an elevation speed of the crucible) is high, the temperature distribution at the surface of the dopant-added melt is likely to become unstable.

It should be noted that, when the silicon monocrystal is pulled up without applying a magnetic field, since the natural convection of the dopant-added melt is basically activated, the temperature distribution is made uniform by the natural convection even when a low-temperature (region temperature unevenness) is locally present in the melt. Accordingly, since the temperature distribution in the dopant-added melt becomes stable when the silicon monocrystal is pulled up without applying the magnetic field, the above correlationship is less applicable.

However, under an environment in which the magnetic field (especially a horizontal magnetic field) is applied, it is speculated that, since the convection of the dopant-added melt is restrained to reduce a heat transport amount, the temperature variation due to the change in the distance between the melt and the cooler directly affects the silicon monocrystal to promote the abnormal growth.

Based on the above considerations, the inventors researched and studied the relationship between the cooler and the dislocation caused at the shoulder, and consequently note that the movement of the cooler during the formation of the shoulder might affect the dislocation caused at the shoulder.

In view of the above, the inventors conducted experiments to examine the correlationship between the dislocation caused at the shoulder and the movement of the cooler.

Experiment 1

While the cooler was lowered stepwise (a lowering distance per one descent: 30 mm) during the formation of the shoulder, a 200-mm-diameter silicon monocrystal was pulled up to manufacture a low-resistivity silicon monocrystal. A length of the obtained low-resistivity silicon monocrystal in the pulling-up direction of the shoulder when an abnormal growth and/or a dislocation occurred was examined. It should be noted that the dopant-added melt was prepared by adding an appropriate amount of dopant (arsenic) to the silicon melt so that the resistivity of the pulled-up silicon monocrystal became 4.0 mΩ·cm or less.

It was found in Experiment 1 that the abnormal growth and dislocation occurred at five points in a portion at which the diameter of the shoulder was less than half of the diameter of the straight body. It was also found that a large number of the abnormal growths occurred at a portion at which the diameter of the shoulder was approximately a half of the diameter of the straight body.

Experiment 2

Except that the lowering distance per one descent of the cooler was set at a smaller value (8.0 mm) than that in the above Experiment 1, the silicon monocrystal was pulled up in the same conditions as those in Experiment 1 to manufacture a 200-mm-diameter low-resistivity silicon monocrystal. A length of the obtained low-resistivity silicon monocrystal in the pulling-up direction of the shoulder when an abnormal growth and/or a dislocation occurred was examined.

In Experiment 2 where the lowering distance of the cooler per one descent was set at 8.0 mm, it was found that the number of abnormal growth in the portion of the shoulder at which the diameter of the shoulder was half or less of the diameter of the straight body was reduced and the dislocation at the portion could also be prevented.

In view of the above results, it was found that the occurrence area of the abnormal growth could be shifted to a later stage by setting a small value for the lowering distance of the cooler per one descent.

Experiment 3

The seed crystal was pulled up with the lowering distance of the cooler per one descent being set at 8.0 mm in the same manner as in the above Experiment 2. Then, in view of the results in the above Experiment 2, the descent of the cooler was stopped after the lower end of the cooler reached a position 200 mm above the dopant-added melt, and the silicon monocrystal was pulled up while keeping the location of the cooler to manufacture a 200-mm-diameter low-resistivity silicon monocrystal. A length of the obtained low-resistivity silicon monocrystal in the pulling-up direction of the shoulder when an abnormal growth and/or a dislocation occurred was examined.

It was found that the abnormal growth caused at the shoulder was reduced in Experiment 3 as compared to the above Experiment 2 by stopping the descent of the cooler when the lower end of the cooler reached the position 200 mm above the dopant-added melt.

It was also found that the abnormal growth was not caused at the portion at which the diameter of the shoulder was a half or more of the diameter of the straight body. It is speculated that the abnormal growth was reduced at the portion at which the diameter of the shoulder was a half or more of the diameter of the straight body because the temperature unevenness at the surface of the dopant-added melt due to the cooled gas from the cooler was restrained by stopping the descent of the cooler at a specific height.

The invention has been reached based on the above findings.

A manufacturing method of a silicon monocrystal according to an aspect of the invention uses a monocrystal pulling-up apparatus comprising a chamber, a crucible disposed in the chamber and configured to receive dopant-added melt in which an n-type dopant is added to silicon melt, a pulling-up unit configured to pull up a seed crystal after the seed crystal is in contact with the dopant-added melt, a cooler disposed above the crucible and configured to cool the silicon monocrystal that is being grown, and a magnetic field applying unit disposed outside the chamber and configured to apply a horizontal magnetic field to the dopant-added melt. The method includes: during a formation of a shoulder of the silicon monocrystal, starting the formation of the shoulder while moving the cooler downward; stopping the cooler from moving downward at a stop position before a top of the shoulder reaches a level of a lower end of the cooler; and continuing the formation of the shoulder while the cooler is kept at the stop position.

According to the above aspect of the invention, even when a large-diameter low-resistivity silicon monocrystal provided by highly densely doping silicon melt with an n-type dopant (e.g. arsenic, red phosphorus and antimony) is pulled up, the dislocation to be caused at the shoulder can be reduced by appropriately controlling the movement of the cooler during the formation of the shoulder.

In the above arrangement, it is preferable that a level of the stop position of the cooler is in a range from 0.75 D to 1.2 D above a surface of the dopant-added melt, where D represents a diameter of the silicon monocrystal to be pulled up.

According to the above arrangement, since the cooler is stopped during the pulling-up process at the stop position in a range from 0.75 D to 1.2 D above the surface of the dopant-added melt where D represents a diameter of the silicon monocrystal to be pulled up, a silicon monocrystal with a reduced abnormal growth at the shoulder thereof can be manufactured.

BRIEF DESCRIPTION OF DRAWING(S)

FIG. 1 schematically illustrates an arrangement of a monocrystal pulling-up apparatus according to an exemplary embodiment of the invention.

DESCRIPTION OF EMBODIMENT(S)

Exemplary embodiment(s) of the invention will be described below with reference to the attached drawing.

Arrangement of Monocrystal Pulling-Up Apparatus

Initially, an arrangement of a monocrystal pulling-up apparatus described below.

As shown in FIG. 1, a monocrystal pulling-up apparatus 1 includes a monocrystal pulling-up apparatus body 10, a doping device (not shown) and a controller (not shown).

The monocrystal pulling-up apparatus body 10 includes a chamber 11, a crucible 12 disposed at the center of the chamber 11, a heater 14 configured to radiate heat to heat the crucible 12, a heat insulating cylinder 15, a pulling-up cable 16 (pulling-up unit), a heat shield 20, a cooler 21, and electromagnetic coils 24 (a magnetic field applying unit).

The crucible 12 is configured to melt a material of the silicon wafer in a form of a polycrystalline silicon to provide silicon melt 19. The crucible 12 has a double structure including a bottomed cylindrical quartz crucible 12A made of quartz and a graphite crucible 12B made of graphite, the graphite crucible 12B being disposed outside the quartz crucible 12A to receive the quartz crucible 12A. The crucible 12 is supported by a support shaft 13 configured to be rotated and vertically moved at a predetermined speed.

The heater 14 is disposed outside the crucible 12 and configured to heat the crucible 12 to melt the silicon in the crucible 12. The heater 14 is a resistance heating heater.

The heat insulating cylinder 15 is disposed along an inner surface of the chamber 11 to surround the crucible 12 and the heater 14.

A first end of the pulling-up cable 16 is connected to a pulling-up driver (not shown) disposed, for instance, above the crucible 12. A seed crystal 17 or a doping device (not shown) is configured to be attached to a second end of the pulling-up cable 16. The pulling-up cable 16 is configured to be driven by the pulling-up driver to be rotatable at a predetermined speed coaxially with the support shaft 13 in the same or reverse direction with respect to a rotation direction of the support shaft 13. The pulling-up cable 16 is configured to be moved upward or downward at a predetermined speed by the pulling-up driver being controlled by the controller.

The cylindrical cooler 21 is disposed in the chamber 11 above the silicon melt 19 in the crucible 12 and configured to surround the silicon monocrystal 18 being pulled up. The cooler 21 is made of a highly thermally conductive metal such as copper and is forcibly cooled by a cooling water circulated inside the cooler 21. The cooler 21 promotes the cooling of the silicon monocrystal 18 being pulled-up to control a temperature gradient between a central portion and an outer peripheral portion of the silicon monocrystal in a pulling-up axis direction.

The cooler 21 is connected with a cooler driver (not shown) and configured to be moved upward or downward at a predetermined speed by the cooler driver being controlled by the controller.

Further, the cylindrical heat shield 20 is disposed in a manner capable of surrounding an outer circumferential surface and a lower end of the cooler 21. The heat shield 20 is configured to shield the silicon monocrystal 18 that is being grown from a high-temperature radiation heat from the silicon melt 19 in the crucible 12, the heater 14 and a sidewall of the crucible 12. Further, the heat shield 20 is also configured to restrain a heat radiation from near a solid-liquid interface to the (low-temperature) cooler 21, and to control the temperature gradient at the central portion and the outer peripheral portion of the silicon monocrystal in the pulling-up axis direction in cooperation with the cooler 21. The heat shield 20 is disposed to cover the surface of the silicon melt 19. The heat shield 20 is in a form of a cone having a lower opening smaller than an upper opening thereof.

A gas inlet 22 for introducing an inactive gas (e.g. Ar gas) into the chamber 11 is provided at an upper side of the chamber 11. A gas outlet 23 for sucking and discharging the gas inside the chamber 11 by a drive of a vacuum pump (not shown) is provided at a lower side of the chamber 11.

The inactive gas is introduced into the chamber 11 at a predetermined flow rate through the gas inlet 22 on the upper side of the chamber 11 under the control of the controller. The introduced gas is discharged through the gas outlet 23 on the lower side of the chamber 11 to allow the inactive gas to flow from the upper side to the lower side in the chamber 11.

The pressure inside the chamber 11 (in-furnace pressure) s controllable by the controller.

A pair of the electromagnetic coils 24 opposed across the crucible 12 are disposed outside the chamber 11. The electromagnetic coils 24 are configured to generate a horizontal magnetic field between the electromagnetic coils 24 to apply the horizontal magnetic field to the silicon melt 19 in the crucible 12. The natural convection of the silicon melt 19 is restrained by applying the horizontal magnetic field.

The doping device is configured to volatilize the solid volatile dopant in a form of arsenic to dope the silicon melt 19 in the crucible 12 with the dopant (i.e. add the dopant in the silicon melt) to provide dopant-added melt 19A. It should be noted that the doping device may include a cylindrical portion, a lower end of the cylindrical portion being configured to be immersed in the silicon melt 19 to add arsenic into the silicon melt 19. Alternatively, the doping device may be configured so that the lower end of the cylindrical portion is located away from the silicon melt 19 and volatilized arsenic is blown to the silicon melt 19 to add arsenic into the silicon melt 19.

The controller controls, as needed, based on an input by an operator, the gas flow rate and the in-furnace pressure inside the chamber 11, a heating temperature in the chamber 11 by the heater 14, the movement of the pulling-up cable 16, the movement of the support shaft 13 and the movement of the cooler 21 to control the manufacturing process of the silicon monocrystal 18.

Manufacturing Method of Silicon Monocrystal

Next, a manufacturing method of the 200-mm-diameter low-resistivity silicon monocrystal 18 with the use of the monocrystal pulling-up apparatus 1 according to the exemplary embodiment will be described below.

Initially, before preparing the dopant-added melt 19A, the cooler 21 is moved upward using the cooler drive unit. Specifically, the cooler 21 is moved to a height at which the cooler 21 is not in contact with the polycrystalline silicon material loaded in the crucible 12 and the cooled gas from the cooler 21 does not reach the polycrystalline silicon material and the crucible 12. The cooling water is circulated inside the cooler 21.

Subsequently, the polycrystalline silicon material is loaded into the crucible 12. The polycrystalline silicon material is loaded in an amount providing a predetermined amount of melt after being melted. The crucible 12 is heated by the heater 14 to melt the polycrystalline silicon material in the crucible 12.

Subsequently, the Ar gas is introduced at a predetermined flow rate through the gas inlet 22 into the chamber 11 and the pressure inside the chamber 11 is reduced to keep the inside of the chamber 11 in a decompressed inactive atmosphere. The doping device is attached to the lower end of the pulling-up cable 16. With the use of the doping device, the volatile dopant in a form of arsenic is added to the silicon melt to prepare the dopant-added melt 19A. The amount of arsenic to be added is preferably determined so that the resistivity of the silicon wafer cut out from the silicon monocrystal 18 is in a range from 1.5 mΩ·cm to 4.0 mΩ·cm.

After preparing the dopant-added melt 19A, the doping device is detached from the lower end of the pulling-up cable 16 and the seed crystal 17 is attached to the lower end in place of the doping device.

Next, the horizontal magnetic field is applied to the dopant-added melt 19A using the electromagnetic coils 24. The intensity of the horizontal magnetic field applied by the electromagnetic coils 24 is preferably in a range from 0.2 T to 0.35 T. When the intensity is less than 0.2 T, the convection-restraining effect on the silicon melt is small, thereby possibly failing to constantly control the diameter of the silicon monocrystal. When the intensity exceeds 0.35 T, the excessively great magnetic-field intensity may adversely affect the apparatus and the environment and increase the production cost of the magnetic-field applying apparatus.

The pulling-up cable 16 is lowered to immerse the seed crystal 17 attached to the lower end of the pulling-up cable 16 in the dopant-added melt 19A.

Then, while rotating the crucible 12 and the pulling-up cable 16 in the predetermined direction(s), the pulling-up cable 16 is gradually pulled up to form a neck portion at a lower side of the seed crystal 17 and subsequently form the shoulder.

In the shoulder formation step, the shoulder is formed while lowering the cooler 21.

The cooler 21 is lowered in a stepwise manner. Supposing that the diameter of the silicon monocrystal to be pulled up is D, the lowering distance of the cooler per one descent is preferably in a range from 0.02 D to 0.06 D. For instance, when the diameter of the silicon monocrystal to be pulled up is 200 mm, the lowering distance per one descent is preferably in a range from 4 mm to 12 mm, more preferably in a range from 5 mm to 11 mm. By setting the lowering distance of the cooler 21 per one descent in the above range, the abnormal growth on the formed shoulder at an early stage of the pulling-up process can be restrained.

It should be noted that, when the lowering distance of the cooler 21 per one descent exceeds the upper limit, the abnormal growth may occur on the formed shoulder at an early stage of the pulling-up process. On the other hand, when the lowering distance of the cooler 21 per one descent is less than the lower limit, though the resultant effect is satisfactory, the control of the lowering movement of the cooler 21 may become complicated.

The descent of the cooler 21 is preferably performed according to the following conditions, though slightly altered depending on the size and structure of the pulling up apparatus, cooling capacity of the cooler 21, resistivity of the silicon monocrystal to be pulled up, pulling-up speed and the like. For instance, when a 200-mm-diameter silicon monocrystal having a resistivity in a range from 1.5 mΩ·cm to 4.0 mΩ·cm is to be pulled up, the cooler 21 is preferably lowered at a rate from 16 mm to 50 mm per a 20 mm shoulder pulling-up length.

The lowering movement of the cooler 21 is stopped before the top of the shoulder being pulled up reaches the lower end of the lowering cooler 21. Then, the shoulder is continuously (i.e. without interruption) formed while the cooler 21 is stopped. Supposing that the diameter of the silicon monocrystal to be pulled up is D, the stop position of the lowering movement of the cooler 21 is preferably at a level in a range from 0.75 D to 1.2 D above the surface of the dopant-added melt 19A. When the level of the stop position is less than 0.75 D above the melt 19A, the cooler 21 is so close to the dopant-added melt 19A that the heat on the surface of the dopant-added melt 19A is deprived of by the cooled gas from the cooler 21, thus making the temperature unstable at the surface of the dopant-added melt 19A. Consequently, the dislocation may occur at the formed shoulder. On the other hand, when the stop position is more than 1.2 D above the melt, the cooled gas from the cooler 21 is unlikely to reach the silicon monocrystal 18 being pulled up, so that sufficient cooling effects by the cooler 21 cannot be obtained. For instance, supposing that the diameter of the silicon monocrystal to be pulled up is 200 mm, the stop position of the lowering movement of the cooler 21 is preferably in a range from 150 mm to 240 mm above the surface of the dopant-added melt.

After finishing the shoulder formation, a predetermined pulling-up length of the straight body and further a tail are formed. The completely pulled up silicon monocrystal 18 is separated from the dopant-added melt 19A. Through the above process, the low-resistivity silicon monocrystal having as large as 200 mm or more diameter can be manufactured without causing the dislocation.

Modification(s)

It should be understood that the scope of the invention is not limited only to the above-described exemplary embodiment(s), but various improvements and modifications of design are possible as long as such improvements and modifications are compatible with an object of the invention.

For instance, though the cooler 21 is lowered in a stepwise manner in the exemplary embodiment, the cooler 21 may be continuously lowered by changing the structure of the apparatus. It is speculated that, when the cooler 21 is continuously lowered, occurrence area of the abnormal growth occurred at the shoulder can be shifted to a further later stage.

Further, though the 200-mm-diameter silicon monocrystal is pulled up in the above exemplary embodiment, the invention is also applicable to a pulling-up process of an over-200-mm diameter (e.g. 300 mm or more diameter) silicon monocrystal.

Though the n-type dopant in a form of arsenic is used in the above exemplary embodiment, such an example is not exhaustive. Since the n-type dopant causes dislocation according to basically the same principle, the invention is applicable to an n-type dopant other than arsenic. For instance, when red phosphorus is used as the n-type dopant, the amount of red phosphorus to be added is preferably determined so that the resistivity of the silicon wafer cut out from the silicon monocrystal is in a range from 0.7 mΩ·cm to 2.0 mΩ·cm. When antimony is used as the n-type dopant, the amount of antimony to be added is preferably determined so that the resistivity of the silicon wafer cut out from the silicon monocrystal is in a range from 8 mΩ·cm to 30 mΩ·cm.

When an epitaxial silicon wafer is to be manufactured from the obtained silicon monocrystal, germanium may be added together with arsenic in order to restrain a misfit dislocation of the epitaxial silicon wafer.

What is claimed is:

1. A manufacturing method of a silicon monocrystal using a monocrystal pulling-up apparatus comprising a chamber; a crucible disposed in the chamber and configured to receive dopant-added melt in which a n-type dopant selected from the group consisting of arsenic, red phosphorus, and antimony is added to silicon melt; a pulling-up unit configured to pull up a seed crystal after the seed crystal is in contact with the dopant-added melt; a cooler disposed above the crucible and configured to cool the silicon monocrystal that is being grown; and a magnetic field applying unit disposed outside the chamber and configured to apply a horizontal magnetic field to the dopant-added melt, the method comprising:

during a formation of a shoulder of the silicon monocrystal, starting the formation of the shoulder while moving the cooler downward;

stopping the cooler from moving downward at a stop position before a top of the shoulder reaches a level of a lower end of the cooler; and continuing the formation of the shoulder while the cooler is kept at the stop position.

2. The manufacturing method of a silicon monocrystal according to claim 1, wherein a level of the stop position of the cooler is in a range from 0.75 D to 1.2 D above a surface of the dopant-added melt, where D represents a diameter of the silicon monocrystal to be pulled up.

* * * * *